United States Patent [19]

Doluca et al.

[11] Patent Number: 4,641,129

[45] Date of Patent: Feb. 3, 1987

[54] ANALOG TO DIGITAL CONVERTER WITH PARALLEL AND SUCCESSIVE APPROXIMATION STAGES

[75] Inventors: Tunc Doluca, Santa Clara; Ziya G. Boyacigiller, Hayward, both of Calif.

[73] Assignee: Intersil, Inc., Cupertino, Calif.

[21] Appl. No.: 578,535

[22] Filed: Feb. 9, 1984

[51] Int. Cl.[4] .............................................. H03M 1/00
[52] U.S. Cl. ................................................. 340/347 AD
[58] Field of Search .................................. 340/347 AD

[56] References Cited

U.S. PATENT DOCUMENTS

| | | | |
|---|---|---|---|
| 3,697,978 | 10/1972 | Prill | 340/347 AD |
| 3,938,188 | 2/1976 | Fletcher et al. | 340/347 AD |
| 4,006,475 | 2/1977 | Candy et al. | 340/347 M |
| 4,485,372 | 11/1984 | Holloway | 340/347 AD |

*Primary Examiner*—Bernard Roskoski
*Attorney, Agent, or Firm*—Stanley C. Corwin; Mark Mollon

[57] ABSTRACT

An improved analog to digital converter in which an approximate digital representation is provided by a parallel analog to digital converter and the conversion is completed by a successive approximation analog to digital converter.

8 Claims, 5 Drawing Figures

ANALOG TO DIGITAL CONVERTER WITH PARALLEL AND SUCCESSIVE APPROXIMATION STAGES

BACKGROUND OF THE INVENTION

1. Field of the Invention

The present invention relates to analog to digital converters.

2. Description of the Prior Art

There are numerous techniques for converting an analog signal to a digital representation. However, previous analog to digital converter circuits employing these techniques have tended to be either relatively slow or inaccurate, or both. For example, one type of analog to digital converter circuit, known as a successive approximation converter, has an addressable latch in which successive digital approximations to the analog input signal are made. The analog value of the digital latch output is compared to the analog input signal after each approximation. The approximations are usually made starting with the most significant bit of the addressable latch, and trying a binary zero (or one) in each bit position. The binary value in that bit position is kept or changed depending upon the comparison of the associated analog value with the analog input signal.

After all the bit positions have been tested, the binary code remaining in the addressable latch is a digital representation of the analog input voltage. These successive approximation converters can, depending upon the number of bit positions in the addressable latch, provide an accurate, high resolution digital output. However, because the bits are computed one at a time, these circuits are often too slow for many high accuracy applications.

Other types of converters include parallel analog to digital converters such as flash converters which compute all the bits (or a group of bits) of the digital output in parallel such that the conversion is done very quickly. However, the accuracy of these circuits is often not very great and the circuits tend to be very large for applications requiring a high resolution output. For example, a typical design for a 2-bit flash converter has four equal series-connected resistors connected to a reference voltage, and four comparators, with one input of each of the comparators connected to a corresponding resistor. The voltages across each of the resistors provide four distinct reference voltages to the four comparators which compare these voltage levels to the analog input signal. Combinational logic converts the outputs of the four comparators to a 2-bit digital representation of the analog input signal.

As seen above, a 2-bit parallel flash converter has four comparators. In general, the number of comparators utilized in a flash converter increases by a factor of two for each additional bit of accuracy. Thus, a 3-bit flash converter typically has eight comparators and a 4-bit flash converter has sixteen converters. Accordingly, it is readily seen that for high accuracy applications requiring a large number of bits, a flash converter can grow unrealizably large and complicated. Some converter circuits have utilized sequentially operated flash converter circuits to reduce the complexity of the circuits, but this approach is not readily adaptable to high resolution converters of twelve bits or more.

SUMMARY OF THE INVENTION

It is an object of the present invention to provide an improved high resolution analog-to-digital converter which is fast, accurate and relatively uncomplicated.

These and other objects and advantages are achieved in an improved analog-to-digital converter circuit which includes a high speed parallel converter and a successive approximation converter. The analog input signal is converted in a first step to an approximate digital representation by the high speed parallel converter wherein the parallel converter provides a plurality of the most significant bits of the digital representation. These most significant bits are loaded into an addressable latch or register of the successive approximation converter which provides the remaining least significant bits thereby completing the conversion of the analog input signal. It has been found that an analog-to-digital converter circuit in accordance with the present invention can perform the conversion faster than can a successive approximation converter of equal resolution, and is significantly less complicated than a typical parallel converter of comparable resolution.

DETAILED DESCRIPTION OF THE DRAWINGS

Figure 1:
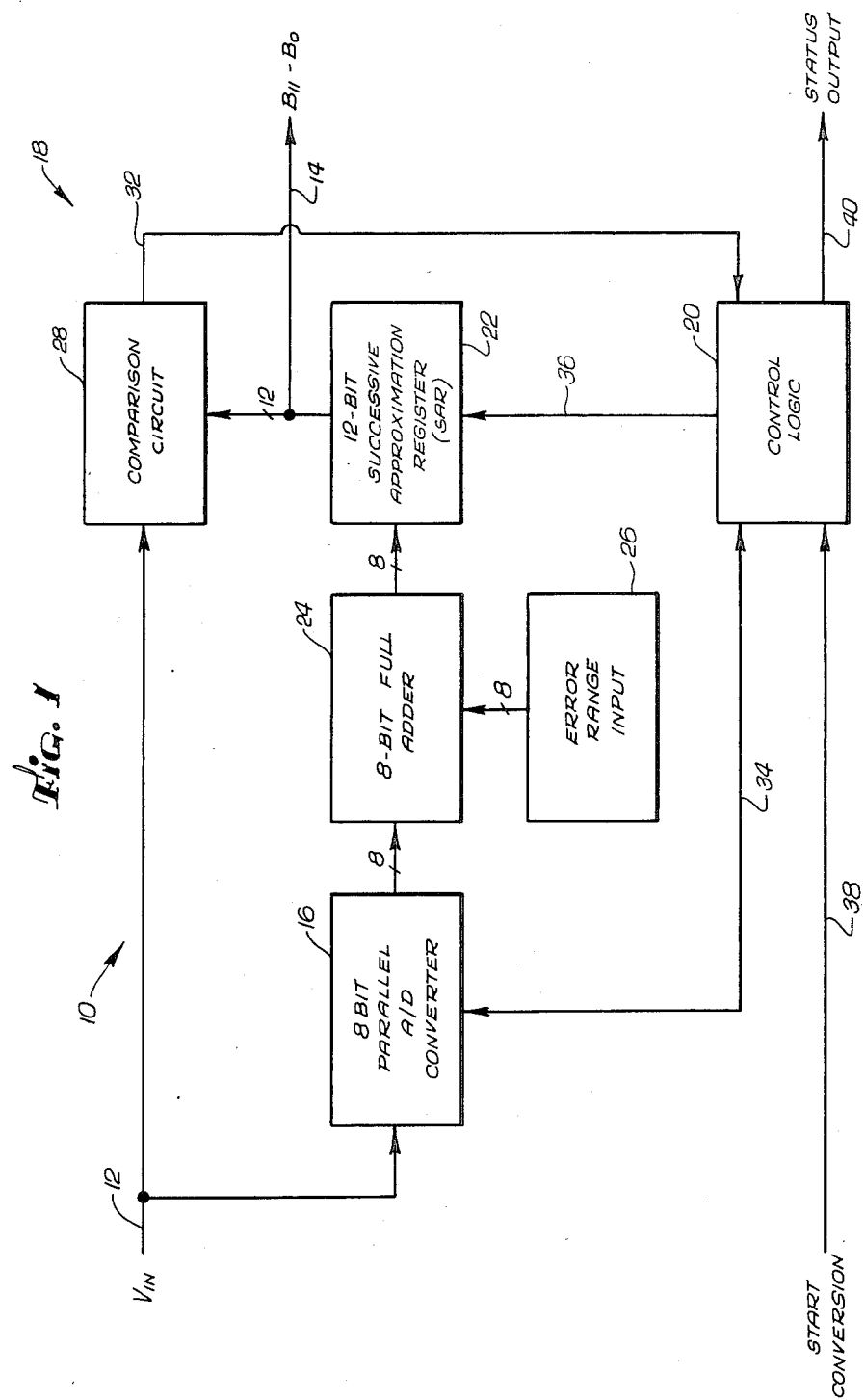
FIG. 1 is a schematic block diagram of an analog to digital converter circuit in accordance with the present invention.

Referring now to FIG. 1, a schematic block diagram is shown illustrating an analog to digital converter circuit in accordance with a preferred embodiment of the present invention. The analog to digital converter circuit is indicated generally at 10 (and is hereinafter often referred to as the "converter 10"). The convertor 10 converts an analog input voltage $V_{IN}$ appearing at an input 12 to a 12-bit digital representation at an output 14. It is recognized of course, that the present invention is applicable to conversion resolutions other than 12 bits.

In accordance with the present invention, the analog input signal $V_{IN}$ is converted to the 12-bit digital output representation in two principal steps. In the first step, the eight most significant bits of the 12-bit output are computed by an 8-bit parallel analog to digital (A/D) converter 16. The remaining 4 bits are computed by a successive approximation (SA) converter 18 in the second step.

Both the parallel A/D converter 16 and the SA converter 18 are controlled by a control logic circuit 20 via control lines indicated at 34 and 36, respectively. The conversion of the analog input signal $V_{IN}$ is initiated upon receipt of a "START CONVERSION" input signal by the control logic 20 at an input 38. Circuitry external to the converter 10 provides the START CONVERSION pulse to the control logic 20 of the converter 10. The control logic 20 also has a plurality of output lines 40 for various status signals to other circuitry.

In the illustrated embodiment, the eight most significant bits are computed in two sequential substeps in which the four high order bits are computed in parallel and then the remaining four low order bits of the first eight bits are computed in parallel as will be more fully explained below. Once the parallel conversion is completed, the bits are loaded into the eight most significant bit positions of an addressable latch. In the illustrated embodiment, the addressable latch includes a 12-bit successive approximation register 22 of the SA converter 18. Because there may be an inaccuracy in the 8-bit result computed by the 8 bit parallel A/D converter 16, a quantity representing the maximum possible error is first subtracted from the 8-bit result by an 8bit full adder 24 before the 8-bit result is loaded into the register 22. This quantity is provided by an error range input circuit 26. Subtracting the known maximum error from the 8-bit result ensures the accuracy of the converter circuit 10 as will also be more fully explained below.

The SA converter 18 includes a comparison circuit 28 which compares the analog input signal $V_{IN}$ at input 12 to the analog value of the digital output of the successive approximation register (SAR) 22. After the eight bits from the full adder 24 loaded into the SAR 22, the comparison circuit 28 compares $V_{IN}$ to the analog value of the SAR 22 output and the eight bits are incremented as necessary by the control logic 20 until the eight most significant bits are correct.

The SA converter 18 is now ready to compute the remaining four bits of the 12-bit output. The control logic 20 successively tests each of the remaining four bit positions one at a time and changes each tested bit position as necessary until the analog value of the SAR 22 output matches the analog input signal $V_{IN}$. After the last bit position has been tested the conversion is complete and the 12-bit number stored in the SAR 22 is a digital representation of the analog input signal $V_{IN}$.

Because a majority of the bit positions of the 12-bit digital output are computed by the 8-bit parallel A/D converter 16, the converter 10 provides a very fast conversion of the analog input signal $V_{IN}$. Furthermore, because the remaining bit positions of the 12-bit digital output are computed by a successive approximation converter 18, the converter 10 provides a high resolution, high accuracy digital output while retaining much of the speed of a conventional parallel converter.

Figure 2:
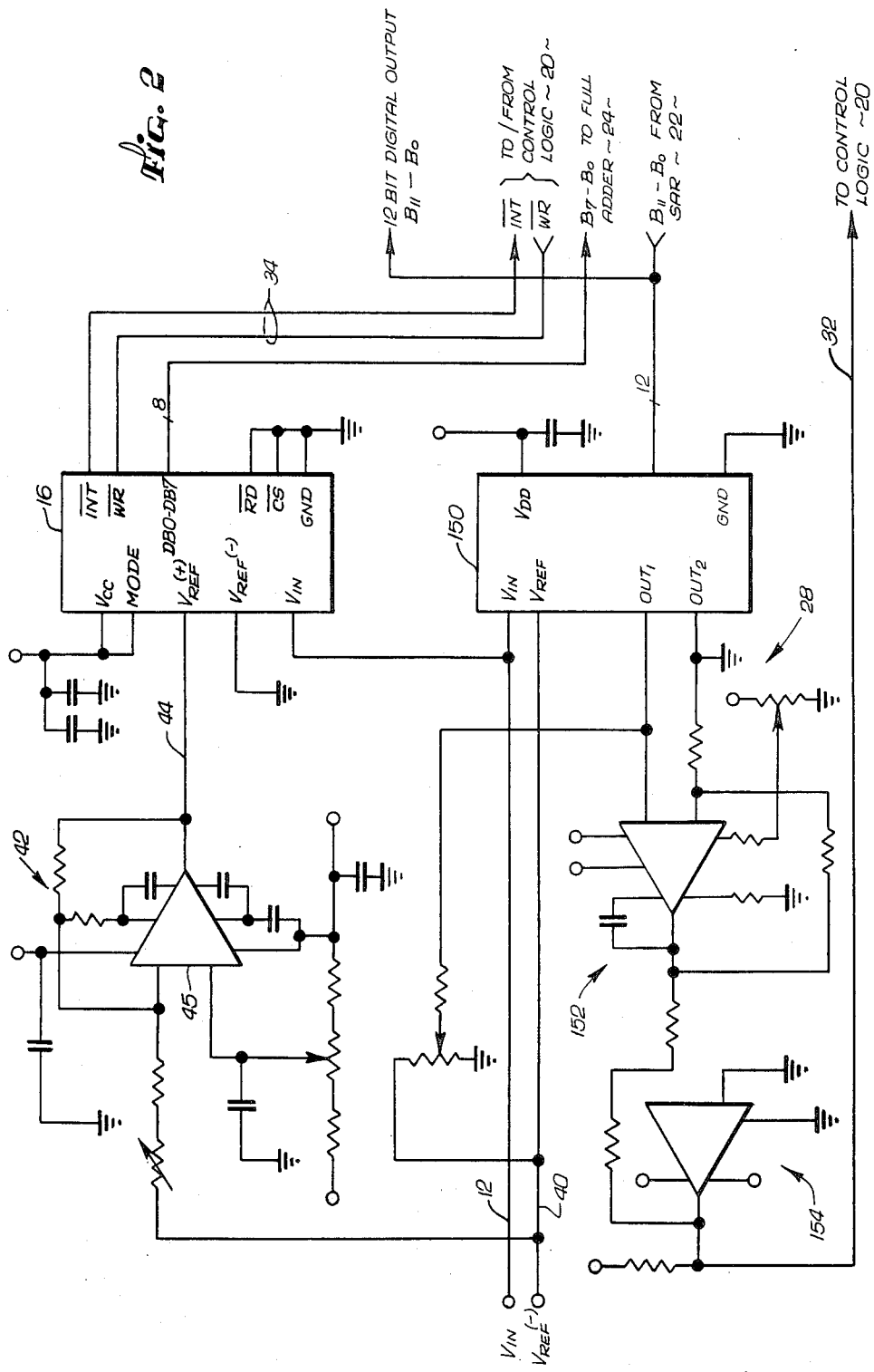
FIG. 2 is a more detailed schematic diagram of a portion of the converter of FIG. 1.
Figure 3:
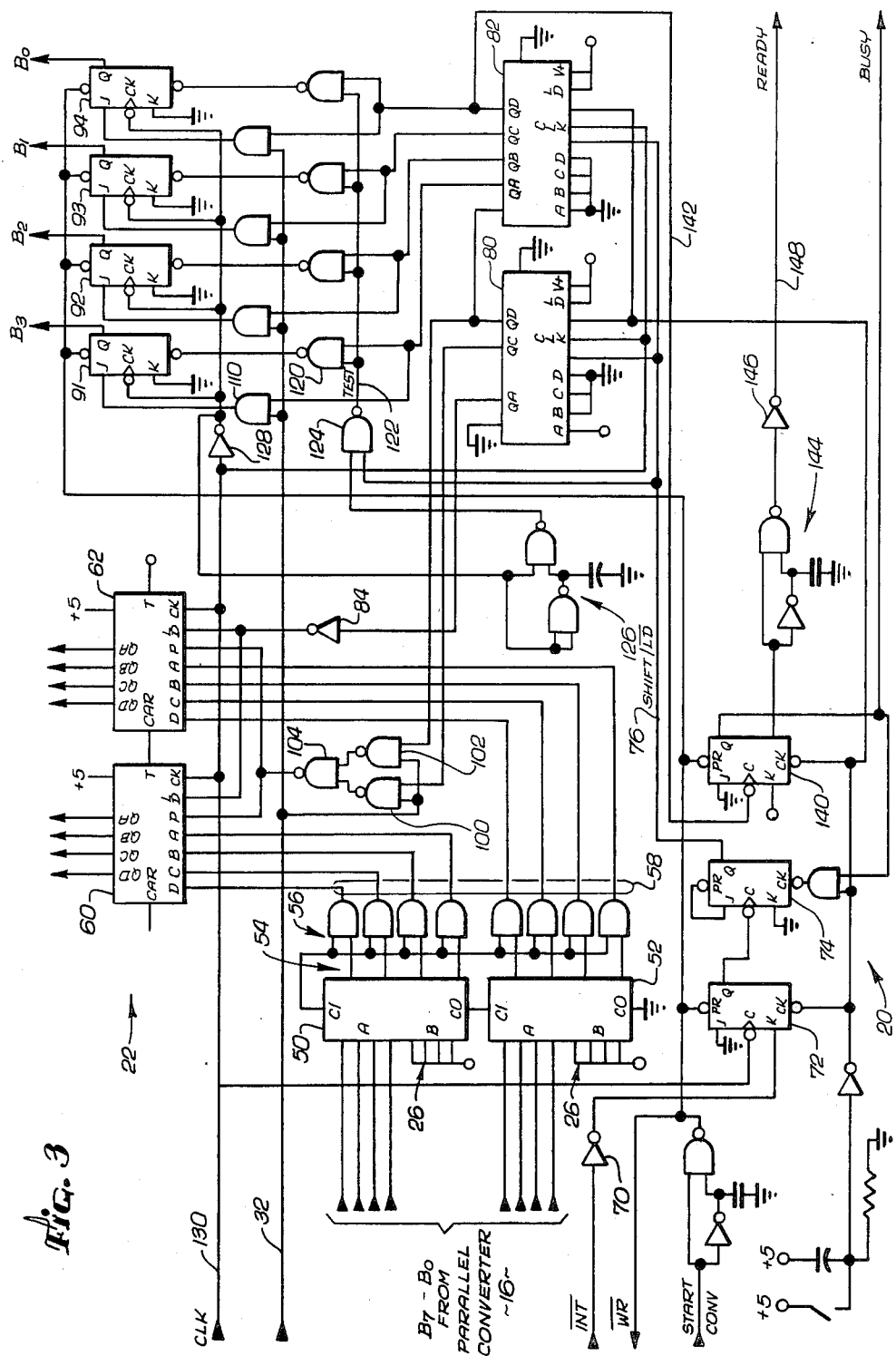
FIG. 3 is a more detailed schematic diagram of a portion of the converter of FIG. 1.

In one embodiment of the present invention, the converter 10 can be implemented utilizing available integrated circuits as shown in FIGS. 2 and 3. Referring particularly to FIG. 2, the 8-bit parallel A/D converter 16 is implemented with a National Semiconductor ADC0820 integrated circuit (IC) chip as indicated at 16 in FIG. 2. The 8-bit conversion is initiated by the parallel A/D converter 16 when the $\overline{WR}$ signal (provided by the control logic 20 (FIG. 3)) goes low. As shown in the timing diagram of FIG. 4, the logical low pulse $\overline{WR}$ is produced in response to the START CONVERSION pulse. After the 8-bit parallel converter 16 receives the $\overline{WR}$ signal at the input indicated, the $\overline{INT}$ output signal line of the converter 16 goes high indicating to the control logic 20 that the 8-bit conversion is in process. The $\overline{u}$ signal does not go low again until the conversion is complete.

It is believed that the ADC0820 IC chip is constructed and operates as follows. The converter 16 has two 4-bit flash converters, a high order 4-bit flash converter and a low order 4-bit flash converter, to give a full 8-bit output. The high order 4-bit flash converter compares the analog input signal $V_{IN}$ on the rising edge of the $\overline{WR}$ signal to a reference voltage utilizing sixteen comparators operating simultaneously. A single negative reference voltage is inverted by an inverter circuit 42 to provide a positive reference voltage at an input line 44 to the converter 16. In the illustrated embodiment, the inverter circuit 42 includes an ICL 8017 amplifier IC indicated at 45.

The positive reference voltage at 44 is applied to sixteen series-connected resistors of equal resistance to provide sixteen incremental reference voltages across the sixteen resistors. The sixteen comparators each have one input connected to an associated resistor and the other input connected to the analog input signal $V_{IN}$. In this manner each comparator compares the analog signal $V_{IN}$ to one of the sixteen incremental reference voltages supplied by the 16 series-connected resistors. Combinational logic coupled to the outputs of the 16 comparators provides the high order 4-bit digital representation of the analog input signal $V_{IN}$. Because the sixteen comparators are operating simultaneously, the four bits are provided in parallel.

Upon completion of the high order 4-bit conversion, a 4-bit digital to analog converter within the converter 16 generates a discrete analog voltage from the results of that conversion. This discrete analog voltage is subtracted from the analog input signal $V_{IN}$ and the analog difference signal is compared by a second bank of 16 comparators of the low order 4-bit converter to sixteen incremental reference voltages provided by a second set of sixteen equal series-connected resistors. Combinational logic converts the outputs of the sixteen comparators to the low order 4-bit digital representation.

Figure 4:
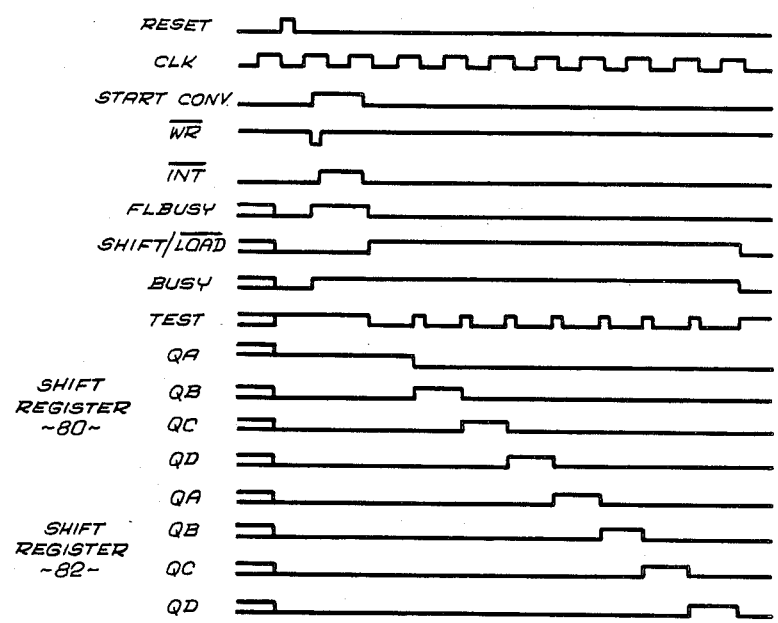
FIG. 4 is a timing diagram for various signals of the converter of FIGS. 2 and 3.

The results from each of the high order and low order conversions are entered into an 8-bit latch and are outputed to the 8-bit output line designated $B_7$–$B_0$. At this time, the output signal $\overline{INT}$ goes low as shown in FIG. 4 indicating to the control logic 20 that the conversion is complete.

As shown in FIG. 1, the eight bits computed by the parallel converter 16 are outputed to the 8-bit full adder 24. Because there may be an inaccuracy in the 8 bits computed by the converter 16, the 8-bit full adder subtracts a quantity equal to the known maximum error of the converter 16. The error range input circuit 26 is programmed to provide this known maximum error to the adder circuit 24 for subtraction from the 8-bit output of the converter 16.

Referring now to FIG. 3, the 8-bit full adder 24 is shown to include a first 4-bit adder circuit 50 and a second 4-bit adder circuit 52. In the illustrated embodiment, each of the 4-bit adder circuits may be implemented utilizing a 74LS83 integrated circuit chip.

The "A" inputs of the adder circuits 50 and 52 are connected to the output lines $B_7$–$B_0$ from the parallel converter 16. In the illustrated embodiment, the known maximum error of the parallel converter 16 is $1_2$. Since adding the 2's complement of $1_2$ to the output of the converter 16 is the same as subtracting $1_2$ from the output of the converter 16, the "B" inputs of the adder circuits 50 and 52 are all connected to the logic one voltage (+5 volts) indicated at 26 providing an input of $11111111_2$ (the 2's complement of $1_2$) at the "B" input. If, for example, the known maximum error of the converter 16 is instead $10_2$, the 2's complement of $10_2$ is inputed at the "B" inputs to subtract $10_2$ from the output of the converter 16.

The resulting sum (or difference) is outputed at 54 to a plurality of AND gates 56. One input of each AND gate is connected to the carry out output "CI" of the adder circuit 50. The carry out output "CI" of the adder circuit 50 is a zero only if the output of the parallel converter 16 is all zero's. Thus, the AND gates 56 ensure that the output of the adder circuit 24 is zero when the output of the parallel converter 16 is zero to prevent a negative number from being outputed by the adder 24.

The output 58 of the adder circuit 24 is provided to the eight most significant bit positions $B_{11}$–$B_4$ of the successive approximation register indicated at 22. In the illustrated embodiment, the eight most significant bits of the successive approximation register 22 are latched by two 4-bit 74LS163 integrated counter circuits 60 and 62, respectively. The remaining four least significant bits will be computed and latched in the J-K flip-flops 91–94 of the SA register 28. These four least significant bit positions are designated $B_3$–$B_0$.

The 8-bit output of the 8-bit full adder 24 is loaded by the counters 60 and 62 on the rising edge of a "load" signal inputted at the input "LD" from the control logic 20. The control logic 20 generates this load signal and other control signals as described below.

The initial state of the control signal at control signal line 76 designated "SHIFT/$\overline{LOAD}$" is a logical low as shown in FIG. 4. This provides a "load" signal to a pair of shift registers 80 and 82. The inputs A-D of the shift register 82 are all connected to ground (logic zero) as are inputs B-D of shift register 80. Input "A" of shift register 80 is connected to +5 volts (logic one), however. Accordingly, the $\overline{LOAD}$ signal on control signal line 76 causes a $1000_2$ and a $0000_2$ to be loaded into the shift registers 80 and 82, respectively.

The logic one state of the $Q_A$ output of the shift register 80 is inverted by an inverter 84 to provide a logic low input to the load inputs LD of the counters 60 and 62 of the SA register 22. In this manner, the 8-bit output of the adder 24 is loaded into the counters 60 and 62.

When the logic state of the control signal line 76 changes to a logic high, the contents of the shift registers 80 and 82 are shifted one position. The control logic 20 generates the "SHIFT" signal on line 76 as follows. The $\overline{INT}$ signal line from the parallel converter 16 is connected by an inverter 70 to the "K" input of a JK flip flop 72 of the control logic 20. When the $\overline{INT}$ signal goes low indicating that the computation of the eight most significant bits by the converter 16 is completed, the Q output of the flip flop 72 goes low clocking a second JK flip flop 74. As the clock input to the flip flop 74 goes low, the Q output of the flip flop 74 goes high. The Q output of the flip flop 74 is connected to the control line 76 which carries the the control signal "SHIFT/$\overline{LOAD}$". As shown in FIG. 4, the "SHIFT" control signal goes high as the $\overline{INT}$ signal from the converter 16 goes low.

When the SHIFT signal goes high, the outputs of the shift registers 80 and 82 are shifted one bit position at the next clock pulse as shown in FIG. 4. The input of the shift register 82 is connected to the last bit position output $Q_D$ of the shift register 80. The input of the shift register 80 is connected to ground (logic zero). Consequently, after the first shift, the outputs of the shift registers 80 and 82 are $0100_2$ and $0000_2$, respectively. As shown in FIG. 3, the output $Q_B$ of the shift register 80, which is now at the logic one state, is not connected to any other circuitry. This allows the counters 60 and 62 sufficient time to settle.

As previously mentioned, the eight most significant bit positions $B_{11}$–$B_4$ of the successive approximation register 18 are provided by the counters 60 and 62 in which is loaded the 8-bit output of the parallel converter 16 (after subtraction of the maximum error by adder 24). The remaining four least significant bits positions $B_3$–$B_0$ provided by four JK flip flops 91–94 are preset to a logic one.

The 12-bit output of the successive approximation register 22 is inputed by the comparison circuit 28 which is shown in greater detail in FIG. 2. The comparison circuit 28 compares the analog value of the 12-bit SAR output to the analog input signal $V_{IN}$. The output of the comparison circuit 28 indicated at 32 is a logic low when the analog input signal $V_{IN}$ is higher than the 12-bit output of the SA register 22.

Referring now to FIG. 3, the output 32 from the comparison circuit 28 is connected to the inputs of two NAND gates 100 and 102, respectively, the outputs of which are connected to the inputs of a third NAND gate 104. The output of the third NAND gate 104 is connected to the "pulse" input of the counter 62.

As previously mentioned, the counters 60 and 62 are allowed to settle after the logic one is shifted to the $Q_B$ output of the shift register 80. On the next clock pulse, the logic one is shifted to the $Q_C$ output as shown in FIG. 4. At that time, the output of the SA register 22 is tested to determine if the eight most significant bits are correct. If the output of the comparison circuit 28 at 32 is a logical low (indicating that the analog value of the output of the SA register 22 is lower than the analog input signal $V_{IN}$, in turn indicating that the digital value of the eight-bits stored in the counters 60 and 62 is too low), the output of the NAND gate 104 will be a logical high causing the counter 62 to increment by one. On the other hand, if the output line 32 from the comparison circuit 28 is a logical high indicating that the digital value of the twelve-bits stored in the SA register 22 are not too low, the eight most significant bits are not incremented by the counters 60 and 62.

The eight bits stored in the counters 60 and 62 are tested one more time on the next clock pulse when the logic one is shifted to the $Q_D$ output of the shift register 80. The logic one value of the $Q_D$ output enables the NAND gate 102 such that the output of the NAND gate 104 either causes the counters 60 and 62 to increment by one or not increment, depending upon the state of the output line 32 of comparison circuit 28.

Two tests of the output of the counters 60 and 62 are provided since the maximum possible error of the parallel converter 16 is $1_2$, and $1_2$ is subtracted from the output of the parallel converter 16 in the illustrated embodiment. For example, if the result of the parallel conversion should have been $00000011_2$, but instead due to an error was $00000010_2$, a $00000001_2$ will be stored in the counters 60 and 62 after a subtraction of $1_2$ by the adder circuit 24. Consequently, after two tests and two increments, the output of the counters 60 and 62 will be the correct value $00000011_2$.

Thus, after two tests, the latching of the correct eight bits $B_{11}$–$B_4$ in the first eight bit positions of the SA register 22 is assured and the converter 10 is then ready to compute and latch the remaining four bits $B_3$–$B_0$ of the digital representation of the analog input signal $V_{IN}$ in the JK flip flops 91–94. As previously mentioned, these four flip flops have been preset to a logical one.

The J input of the JK flip flop 91 for the $B_3$ bit position is connected to the output of an AND gate 110, one input of which is connected to the comparison circuit output line 32 and the other input is connected to the $Q_A$ output of the shift register 82. The J inputs of the remaining JK flip flops 92–94 are similarly connected to outputs of AND gates, each of which has an input connected to the comparison circuit output 32 and an input connected to one of the outputs $Q_B$–$Q_D$ of the shift register 82.

The clear input "CL" of the JK flip flop 91 for the bit position $B_3$ is connected to the output of a NAND gate 120, one input of which is connected to the "TEST" signal line 122 and the other input is connected to the $Q_A$ output of the shift register 82. The clear inputs of the remaining bit position JK flip flops 92–94 are similarly connected to NAND gates which have one input connected to the TEST control signal line 122 and the other input connected to one of the shift register 82 outputs $Q_B$–$Q_D$. The TEST control signal line 122 is the output of a NAND gate 124 which has one input connected to a one-shot circuit 126, the input of which is coupled by an inverter 128 to the clock control signal line 130. The other input of the NAND gate 124 is connected to the SHIFT/LOAD control signal line 76. When the logic value of the control signal line 76 is a logic high, each clock pulse on the clock signal line 130 produces a short TEST pulse on the control signal line 122 as illustrated in FIG. 4.

After the logic one has been shifted into the $Q_D$ output of the shift register 80 for the second test of the $B_{11}$–$B_4$ bit positions, upon the next clock pulse, the logic one is shifted into the $Q_A$ output of the shift register 82. The logic one in the $Q_A$ output of the shift register 82 enables the NAND gate 120 so that the TEST pulse on control signal line 122 clears JK flip-flop 91. Consequently, a zero is loaded into the bit position $B_3$ and the resulting analog value of the 12-bits stored in the SA register 22 is compared to the analog value of the analog input signal $V_{IN}$. If the analog value of the 12-bit member stored in the SA register 22 is greater than $V_{IN}$, the zero is kept in bit position $B_3$—otherwise the $B_3$ bit position is returned to logic one. Specifically, if the analog value of the 12-bit output of the SA register 22 is less than the analog input signal $V_{IN}$, the output 32 of the comparison circuit 28 will be a logic one such that the output of the AND gate 110 will also be a logic one setting the output of the flip flop 91 to a one —otherwise the output of the flip flop 91 remains at zero.

The successive approximation conversion continues successively setting each of the remaining bit positions to a zero, comparing the SA register output to the input signal $V_{IN}$ after the bit position is set to zero and setting or resetting the associated flip flop as the logic one is successively shifted through the shift register 82 on successive clock pulses. After the last bit position $B_0$ has been tested and set (or reset), the conversion is complete.

As shown in FIG. 3, clock input of a JK flip flop 140 is connected by a line 142 to the $Q_D$ output of the shift register 82. The $\overline{Q}$ output of the flip flop 140 is connected to the input of a one-shot circuit 144, the output of which is connected by an inverter 146 to a "READY" output signal control line 148. When the logical one is shifted into the $Q_D$ output of the shift register 82 completing the conversion of the analog input signal $V_{IN}$, the $\overline{Q}$ output of the flip flop 140 changes state. This produces a change of state of the "READY" output line 148 indicating that the coversion has been completed and the converter 10 is ready to convert another analog input signal.

Referring now to FIG. 2, the comparison circuit 28 is shown in greater detail. The comparison circuit 28 includes a digital to analog converter 150 which has 12 inputs connected to the 12-bit output $B_{11}$–$B_0$ of the successive approximation register 22 (FIG. 3). In the illustrated embodiment, the digital to analog converter 150 may be implemented with an Intersil AD7541 integrated circuit chip.

The converter 150 has an input connected to the analog input signal $V_{IN}$ and a second input connected to the negative reference input signal VREF (−). The converter circuit 150 compares the analog value of the 12-bit digital representation from the SA register 22 to the analog input signal $V_{IN}$. The converter circuit 150 also has two outputs designated IOUT$_1$ and IOUT$_2$. The output IOUT$_2$ is connected to ground. The voltage at the converter output IOUT$_1$ will be either higher or lower than the voltage at converter output IOUT$_2$ (ground) depending upon whether the analog input signal $V_{IN}$ is greater or lower, respectively, of the analog value of the 12 bit digital representation from the successive approximation register 22.

The voltages of the outputs IOUT$_2$ and IOUT$_1$ are compared by a comparator circuit 152, the output of which is inverted by an inverter circuit 154. The output of the inverter circuit 154 is connected by the comparison circuit 28 output control signal line 32 to the control logic 20 (FIG. 3).

Figure 5:
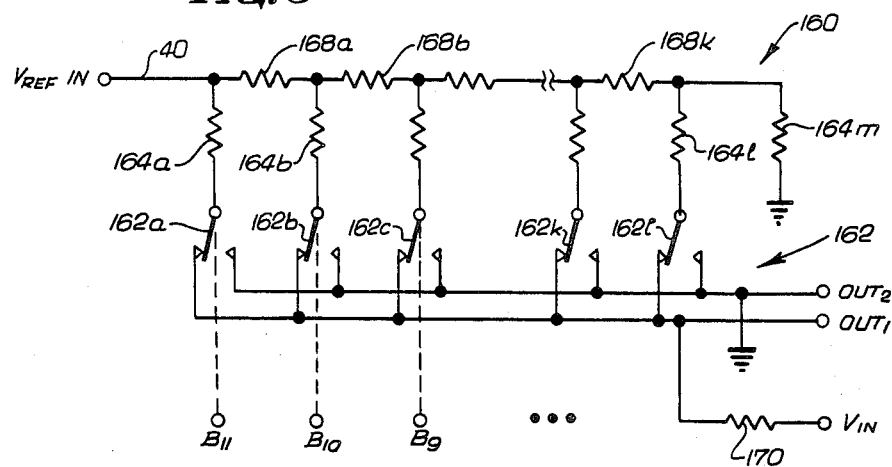
FIG. 5. is a schematic diagram of the digital to analog converter of FIG. 2.

A simplified equivalent schematic diagram of the Intersil AD7541 integrated circuit chip 150 is shown in FIG. 5. The circuit 150 includes an R-2R resistor ladder network 160 and a plurality of NMOS single-pole-double throw (SPDT) switches 162$a$–162$l$. The resistor ladder network 160 has 12 resistor branches or legs 164$a$–164$l$. Each resistor leg 164$a$–164$l$ is connected to one of the switches 162$a$–162$l$. Interconnecting each pair of adjacent resistor legs is a resistor 168$a$–168$k$ which has half of the resistance of the resistors in the legs. In the illustrated embodiment, the resistor of the legs 164$a$–164-1 are 20k ohms and the resistors 168$a$–168$k$ are each 10k ohms, hence the designation R-2R ladder. An additional 20k ohm leg 164$m$ is connected to the junction of the leg 164$l$ and the resistor 168$k$.

The reference voltage $V_{REF}$ is applied at one input to the network 160 indicated at 40. The R-2R ladder of the resistor network 160 produces binary weighted currents through the register legs 164$a$–164$m$ of the R-2R ladder. For example, if each of the resistor legs 164$a$–164$m$ is connected to the same potential, half the total current through the network 160 will pass through leg 164$a$, one-fourth the current through leg 164$b$, one-eighth the current through leg 164$c$ and so on with $\frac{1}{2}^{12}$ of the current passing through each of the legs 164$l$ and 164$m$.

As previously mentioned, the converter curcuit 150 has two outputs designated OUT$_2$ and OUT$_1$ with output OUT$_2$ externally coupled to ground as indicated in phantom. Output OUT$_1$ is connected to one pole of each of the switches 162$a$–162$l$ and the other output OUT$_2$ is connected to the other pole of the switches 162$a$–162$l$. The state of the switches 162$a$–162$l$ is controlled by the logic states of the 12-bit output $B_{11}$–$B_0$ respectively, of the successive approximation register 22. For example, if the logic states of the outputs $B_{11}$–$B_0$ of the SA register 22 are all logical one, each of the legs 164a–164l will be connected to the output OUT$_1$ as shown in FIG. 5. However, wherever the logic state of an SA register 22 output is logical zero, the associated switch 162a–162l will connect the associated network leg to the output OUT$_2$. Thus, the outputs OUT$_1$ and OUT$_2$ form summimg junctions for summing selected individual currents through the network legs 164a–164l, depending upon the states of the switches 162A–162L.

The output OUT$_1$ is coupled to the analog input signal V$_{IN}$ through a resistor 170. The potential at the output OUT$_1$ depends upon the relative magnitudes of the input voltages V$_{IN}$ and V$_{REF}$ and the respective states of the switches 162a–162l. It has been determined that if V$_{REF}$ equals minus ⅞ times the full scale value of V$_{IN}$, the potential at output OUT$_1$ will equal the potential at OUT$_2$ when the output of the successive approximation register 22 controlling the states of the switches 162a–162l contains the correct digital representation of the analog input signal V$_{IN}$. Consequently, if the digital number stored in the SA register 22 is too large, the potential at OUT$_1$ will be negative producing a logical zero at the comparison circuit 28 output control signal line 32. Alternatively, if the digital number stored in SA register 22 is too low, the potential at output OUT$_1$ will be positive producing a logic one on the output line 32. As previously mentioned, a logical one at the output line 32 causes the counter 62 to increment during the testing phase of the first eight bits, or causes a one to be set into the JK flipflops 91–94 during the successive approximation portion of the conversion process.

In summary, the analog input signal V$_{IN}$ is converted to a 12 bit digital representation in two principal steps. In the first step, the 8-bit parallel A/D converter 16 computes the eight most significant bits in parallel, four bits at a time. The remaining four bits are computed by the successive approximation analog to digital converter 18. The successive approximation converter starts with the eight most significant bits computed by the 8-bit parallel A/D converter 16 (reduced by an appropriate value to allow for the maximum rated inaccuracy in the parallel conversion) and stores a preset value into the remaining four bit positions of the successive approximation register 22. Before computing the remaining four bits, the successive approximation converter 18 increments the eight bit result of the parallel converter 16 as necessary to ensure that the eight most significant bits are correct. The successive approximation converter 18 then successively tests and sets each of the remaining four bit positions comparing the analog value of the output of the SAR 22 with the analog input signal V$_{IN}$.

It will, of course, be understood that modifications of the present invention, in its various aspects, will be apparent to those skilled in the art, some being apparent only after study and others being merely matters of routine electronic design. For example, the converter 10 may be constructed as a single monolithic integrated circuit chip. In addition, the analog to digital converter of the present invention may use other types of parallel converters such as the converter disclosed in co-pending application Ser. No.579,276 filed Feb. 13, 1984, owned by the assignee of the present application and entitled "Improved Flash Analog to Digital Converter" by Tunc Doluca. Other embodiments are also possible, with their specific designs dependant upon the particular application. As such, the scope of the invention should not be limited by the particular embodiment herein described, but should be defined only by the appended claims and equivalents thereof.

We claim:

1. An analog to digital converter for converting an analog input signal to a digital representation having n bits which include a plurality of more significant bits and a plurality of less significant bits, the converter comprising:

flash analog to digital converter means for converting the analog input signal to an approximate digital representation wherein the flash converter includes a plurality of series connected resistors, each resistor having a comparator associated therewith for comparing the analog signal with the voltage at the associated resistor, and encoder means for encoding the output of the comparators to provide the more significant bits of the digital representation;

a register having n bit positions for storing an n-bit digital representation, said bit positions including positions for storing the plurality of more significant bits provided by the flash converter means, and positions corresponding to the plurality of less significant bits;

comparison means for comparing the analog value of the n-bit digital representation stored in the register and the analog input signal and for providing an output in accordance with said comparison;

means responsive to the comparison means for successively testing each less significant bit position of the register and changing the bit values of the bit positions as required so that the analog value of the n-bit digital representation substantially equals the analog input signal wherein the bits stored in the register are an n-bit digital representation of the analog input signals; and means for subtracting a predetermined amount from the more significant bits prior to storing the more significant bits into the register wherein the amount subtracted is a function of the expected accuracy of the flash converter means.

2. The converter of claim 1 further comprising means responsive to the comparison means for incrementing selected bit positions of the more significant bits stored in the register if the analog value of the digital representation is lower than the analog input signal.

3. An analog to digital converter for converting an analog input signal to a digital representation having n bits which include a plurality of more significant bits and a plurality of less significant bits, the converter comprising:

flash analog to digital converter means for converting the analog input signal to an approximate digital representation wherein the flash converter includes a plurality of series connected resistors, each resistor having a comparator associated therewith for comparing the analog signal with the voltage at the associated resistor, and encoder means for encoding the output of the comparators to provide the more significant bits of the digital representation;

a register having n bit positions for storing an n-bit digital representation, said bit positions including positions for storing the plurality of more significant bits provided by the flash converter means, and positons corresponding to the plurality of less significant bits;

comparison means for comparing the analog value of the n-bit digital representation stored in the register and the analog input signal and for providing an output in accordance with said comparison;

means responsive to the comparison means for successively testing each less significant bit position of the register and changing the bit values of the bit positions as required so that the analog value of the n-bit digital representation substantially equals the analog input signal wherein the bits stored in the register are an n-bit digital representation of the analog input signals; and means for adding a predetermined amount to the more significant bits prior to storing the more significant bits into the register wherein the amount added is a function of the expected accuracy of the flash converter means.

4. The converter of claim 3 further comprising means responsive to the comparison means for decrementing selected bit positions of the more significant bits stored in the register if the analog value of the digital representation is higher than the analog input signal.

5. A high speed analog-to-digital converter for converting an analog input signal to a digital representation having a plurality of bits which include a first plurality of more significant bits and a second plurality of less significant bits, said converter comprising:
   parallel analog-to-digital converter means for converting the analog signal to an approximate digital representation which includes the first plurality of more significant bits, said converter means having means for converting at least two of the first plurality of bits from the analog input signal in parallel;
   successive approximation analog to digital converter means responsive to the parallel analog to digital converter means, for completing the conversion of the analog signal to a digital representation which includes the less significant digits, wherein the less significant digits are provided by a successive approximation analog to digital technique; and
   means for modifying the approximate digital representation computed by the parallel analog to digital converter means by a first predetermined value to provide a first plurality of more significant test bits, said successive approximation analog to digital converter means further comprising means for successively comparing the first plurality of more significant test bits to the analog input signal and modifying the first plurality of more significant test bits by a second predetermined value as necessary until the analog value of the modified first plurality of more significant bits differs by less than a third predetermined value from the analog input signal.

6. The converter of claim 5 wherein the successesive approximation analog to digital converter means for modifying the first plurality of more significant bits includes a counter.

7. A high speed analog to digital converter for converting an analog input signal to a digital representation having a plurality of bits which include a first plurality of more significant bits and a second plurality of less significant bits, said converter comprising:
   a successive approximation register having a first plurality of more significant bit positions and a second plurality of less significant bit positions for storing the first and second plurality of bits, respectively;
   parallel analog to digital converter means for converting the analog signal to an approximate digital representation which includes a first plurality of more significant bits, wherein at least two of the first plurality of bits are computed in parallel;
   means for subtracting a predetermined quantity corresponding to the maximum possible error of the parallel analog to digital converter means from the plurality of more significant bits computed by the parallel analog to digital converter means and storing the resultant difference in the first plurality of bit positions of the successive approximation register;
   comparison means for comparing the analog value of the digital numbers stored in the successive approximation register to the analog input signal and providing a comparison signal in accordance with the comparison;
   and control means responsive to the comparison means for successively incrementing the first plurality of bits stored in the successive approximation register if the analog value of the number stored in the successive approximation register is less than analog input signal, said comparison occurring a predetermined number of times and for storing a test value into each of the less significant bit positions of the successive approximation register and successively testing each of the less significant bit positions and setting the value of the tested bit position as required in accordance with the comparison of the analog value of the representation stored in the successive approximation register to the analog input signal.

8. An analog to digital converter for converting an analog input signal to a digital representation having n bits which include a plurality of more significant bits and a plurality of less significant bits, the converter comprising:
   flash analog to digital converter means for converting the analog input signal to an approximate digital representation wherein the flash converter includes a plurality of series connected resistors, each resistor having a comparator associated therewith for comparing the analog signal with the voltage at the associated resistor, an encoder means for encoding the output of the comparators to provide the more significant bits of the digital representation;
   a register having n bit positions for storing an n-bit digital representation, said bit positions including positions for storing the plurality of more significant bits provided by the flash converter means, and positions corresponding to the plurality of less significant bits;
   comparison means for comparing the analog value of the n-bit digital representation stored in the register and the analog input signal and for providing an output in accordance with said comparison; and
   means responsive to the comparison means for successively testing each less significant bit position of the register and changing the bit values of the bit positions as required so that the analog value of the n-bit digital representation substantially equals the analog input signal wherein the bits stored in the register are an n-bit digital representation of the analog input signals;
   wherein the register comprises a digital counter having a plurality of output bit positons;
   said converter further comprising control means for subtracting a predetermined amount from the more significant bits output by the flash converter means to produce a digital difference value, said predetermined amount being a function of the expected accuracy of the flash converter means; said control means also for presetting the counter output bit positions to the digital difference value; for presetting each least significant bit position of the register to a logical one value; and for incrementing the output of the counter if the analog value of the digital representation output by the register is lower than the analog input signal.

* * * * *